(12) United States Patent
Ryugo et al.

(10) Patent No.: US 6,337,123 B1
(45) Date of Patent: Jan. 8, 2002

(54) MULTILAYERED CERAMIC SUBSTRATE AND METHOD OF PRODUCING THE SAME

(75) Inventors: Koji Ryugo; Mitsuyoshi Nishide, both of Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/644,481

(22) Filed: Aug. 23, 2000

(30) Foreign Application Priority Data

Oct. 21, 1999 (JP) .......................................... 11-299376

(51) Int. Cl.$^7$ ................................................ B32B 3/00
(52) U.S. Cl. ....................... 428/210; 428/209; 428/901; 174/258; 174/259
(58) Field of Search ................................ 428/209, 210, 428/901; 174/258, 259

(56) References Cited

U.S. PATENT DOCUMENTS

| | | | |
|---|---|---|---|
| 5,102,720 A | 4/1992 | Raj | ............................ 421/209 |
| 5,827,605 A | * 10/1998 | Nishide et al. | ............. 428/209 |
| 5,840,382 A | * 11/1998 | Nishide et al. | ............. 428/209 |

* cited by examiner

Primary Examiner—Cathy Lam
(74) Attorney, Agent, or Firm—Ostrolenk, Faber, Gerb & Soffen, LL (57) ABSTRACT

A multilayered ceramic substrate which includes at least two types of ceramic layers respectively containing different ceramic materials, and which can be produced by simultaneous firing without causing layer peeling is described. A green composite laminated product is prepared in a state in which two substrate green sheets respectively contain different types of low-temperature sintered ceramic materials, and a shrinkage inhibiting green sheet containing an inorganic material which is not sintered at the sintering temperature of each of the low-temperature sintered ceramic material is arranged between the two substrate green sheets, followed by firing. In the firing step, the low-temperature sintered ceramic materials are sintered while inhibiting shrinkage of the substrate green sheets in the direction parallel to the main surfaces thereof by the shrinkage inhibiting green sheet, while the inorganic material remains unsintered and is fixed by glass supplied by firing the low-temperature sintered ceramic materials.

20 Claims, 2 Drawing Sheets

MULTILAYERED CERAMIC SUBSTRATE AND METHOD OF PRODUCING THE SAME

BACKGROUND OF THE INVENTION

1. Field of the Invention

The present invention relates to a multilayered ceramic substrate produced by applying a non-shrinkage process which is capable of substantially preventing the occurrence of shrinkage in the direction parallel to a main surface in a firing step, and a method of producing the same. Particularly, the present invention relates to a multilayered ceramic substrate comprising at least two types of ceramic layers having different characteristics, and a method of producing the same.

2. Description of the Related Art

Some multilayered ceramic substrates have a stricture comprising a built-in passive part such as a capacitor element or an inductor element provided for making the substrates multifunctional. A typical example of the structures of such multifunctional multilayered ceramic substrates comprises a plurality of insulating ceramic layers comprising insulating ceramic materials which constitute a laminated structure in a multilayered ceramic substrate, at least one the insulating ceramic layers being replaced by a dielectric ceramic layer or a magnetic ceramic layer containing a dielectric ceramic material or magnetic ceramic material so that a capacitor element or the inductor element is formed in connection with the dielectric ceramic layer or the magnetic ceramic layer.

In producing the above-described multilayered ceramic substrate, besides an insulating green sheet containing an insulating ceramic material, a dielectric or magnetic green sheet containing a dielectric or magnetic material different from the insulating ceramic material is prepared, and these different types of green sheets containing different ceramic materials are laminated to obtain a laminated structure, followed by co-firing.

In the firing step, the different ceramic materials contained in the respective green sheets generally exhibit different behaviors of sintering shrinkage, and thus in order to permit co-firing of the different types of green sheets, it is necessary to cause the sintering shrinkage behaviors to coincide with each other as much as possible.

Therefore, a measure is taken in which the ceramic material contained in at least one type of green sheet is changed, glass is added to at least one type of green sheet or a portion of the ceramic material contained in one type of green sheet is added to the other type of green sheet.

However, the above measure to change the ceramic material, add glass or add a portion of the ceramic material contained in one type of green sheet to the other type causes an undesired change or deterioration in various characteristics, for example, such as insulation resistance, dielectric constant, dielectric loss, temperature characteristics, etc. in some cases.

The above-described addition causes a change in characteristics in the interface between ceramic layers due to mutual diffusion of the added glass or ceramic material, thereby causing dispersion of characteristics.

In order to solve the problem of mutual diffusion, an attempt is made to provide a diffusion inhibiting layer as an intermediate layer between different types of green sheets to inhibit the diffusion or lengthen the diffusion length, thereby decreasing the effect of the mutual diffusion.

However, the adoption of the above measure requires the coincidence of the shrinkage behavior of the intermediate layer serving as the diffusion preventing layer with the other green sheets, thereby causing the need to add glass or the like to the intermediate layer. Therefore, the above measure can obtain only the effect of relieving a change or deterioration in characteristics with a gradient between different types of ceramic layers.

With a great difference between the shrinkage behaviors of different types of adjacent green sheets, the thickness of the intermediate layer must be significantly increased, or a plurality of intermediate layers having a stepwise thickness gradient are required for relieving the stress caused by the difference between the shrinkage behaviors.

However, an increase in the thickness of the intermediate layer, or the formation of a plurality of intermediate layers leads to deterioration in characteristics of the multilayered ceramic substrate or an increase in the thickness thereof, thereby causing many practical problems in the multilayered ceramic substrate which can be integrally fired.

SUMMARY OF THE INVENTION

Accordingly, it is an object of the present invention to provide a multilayered ceramic substrate and a method of producing the same which can solve the above problem.

In order to solve the above technical problem, the present invention provides technical means in which two substrate green sheets containing different low-temperature sintered ceramic materials are fired in a state wherein a shrinkage inhibiting green sheet containing an inorganic material which is not sintered at the sintering temperature of each of the low-temperature sintered ceramic materials is held between the two substrate green sheets. Therefore, the shrinkage inhibiting green sheet restrains the substrate green sheets to prevent the occurrence of sintering shrinkage in the direction parallel to main surfaces so that shrinkage occurs only in the direction of the thickness. Thus, even with a difference between the shrinkage behaviors of the two substrate green sheets, the occurrence of stress due to the difference between the shrinkage behaviors of the two substrate green sheets can be substantially prevented.

By using the technical means, the shrinkage inhibiting green sheet serving as the intermediate layer becomes a layer in which many voids are present in an unsintered state because the inorganic material contained in the shrinkage inhibiting green sheet need not be sintered in the firing step. On the other hand, the low-temperature sintered ceramic materials contained in the substrate green sheets produce fused glass by firing, and the fused glass is absorbed by diffusion into the voids of the inorganic material. Therefore, glass diffusion from one of the substrate green sheets to the other substrate green sheet can be inhibited to prevent the occurrence of a change or deterioration in characteristics.

The intermediate layer has no need to obliquely relieve stress by using the thickness, and a thickness designed to be sufficient for absorbing the glass caused by the substrate green sheets can be used, thereby causing no need to significantly increase the thickness.

By using the technical means, a multilayered ceramic substrate and a method of producing the same are provided.

Namely, the multilayered ceramic substrate of the present invention comprises at least two types of substrate ceramic layers containing different low-temperature sintered ceramic materials, a shrinkage inhibiting layer which is provided between the different types of substrate ceramic layers, and which contains an inorganic material in an unsintered state, which is not sintered at the sintering temperature of each of the low-temperature sintered ceramic materials, so that the inorganic material is fixed by glass permeating into the inorganic material during firing the low-temperature sintered ceramic materials contained in the substrate ceramic layers, and a wiring conductor provided in connection with the substrate ceramic layers and/or the shrinkage inhibiting layer.

In the multilayered ceramic substrate of the present invention, as a conductive material which constitutes the wiring conductor, for example, a low-resistance conductive material comprising, as a main component, at least one metal selected from Ag, Au, Cu, Ag—Pd and Ag—Pt can be used.

The wiring conductor is formed in the multilayered ceramic substrate or formed on the external surface. The wiring conductor comprises, for example, a planar conductor provided along a main surface of the specified substrate ceramic layer or a via hole conductor provided to pass through a specified substrate ceramic layer and/or the shrinkage inhibiting layer according to the design of electric connection required for the multilayered ceramic substrate.

The multilayered ceramic substrate of the present invention may further comprise a cavity having an opening which faces the outer surface thereof.

The method of producing a multilayered ceramic substrate of the present invention comprising the step of preparing a green composite laminated product comprising at least two types of substrate green sheets containing different low-temperature sintered ceramic materials, a shrinkage inhibiting green sheet which is provided between the different types of substrate green sheets and which contains an inorganic material not sintered at the sintering temperature of each of the low-temperature sintered ceramic materials, and a wiring conductor provided in connection with the substrate green sheets and/or the shrinkage inhibiting green sheet, and the step of firing the green composite laminated structure.

In the firing step, the low-temperature sintered ceramic material contained in each of the substrate green sheets is sintered while inhibiting shrinkage in the direction of the main surfaces of each of the substrate green sheets by the shrinkage inhibiting green sheet, and the inorganic material contained in the shrinkage inhibiting green sheet is fixed by glass permeating into the inorganic material when firing the low-temperature sintered ceramic materials, while being left in an unsintered state.

In the method of producing a multilayered ceramic substrate of the present invention, the step of preparing the green composite laminated structure may comprise the step of preparing each of the substrate green sheets and the shrinkage inhibiting green sheet, and the step of laminating the substrate green sheets and the shrinkage inhibiting green sheet, or comprise the step of preparing the substrate green sheets, the step of preparing a slurry containing the inorganic material, and the step of coating the slurry on each of the substrate green sheets to form the shrinkage inhibiting green sheet. As a modified example of the latter case, in order to prepare the green composite laminated product, the shrinkage inhibiting green sheet may be prepared, and a slurry containing a low-temperature sintered ceramic material may be prepared so that the slurry is coated on the shrinkage inhibiting green sheet to form the substrate green sheet.

In the method of producing a multilayered ceramic substrate of the present invention, the low-temperature sintered ceramic material contained in each of the substrate green sheets is preferably sinterable at a temperature of about 1000° C. or less.

In the method of producing a multilayered ceramic substrate of the present invention, the thickness of the shrinkage inhibiting green sheet is preferably selected in the range from about 1 μm to less than about 30 μm.

In the method of producing a multilayered ceramic substrate of the present invention, the shrinkage inhibiting green sheet may contain at least one additive selected from glass, oxides and metals for supporting the fixing of the inorganic material in an amount of about 60% by weight or less based on the inorganic material. In this case, the thickness of the shrinkage inhibiting green sheet can be increased to about 50 μm or less.

In the method of producing a multilayered ceramic substrate of the present invention, the sintering temperature of the inorganic material contained in the shrinkage inhibiting green sheet or the sintering temperature of the inorganic material and the additive for supporting sintering of the inorganic material is preferably about 100° C. or more higher than the sintering temperature of each of the low-temperature sintered ceramic materials.

DESCRIPTION OF THE PREFERRED EMBODIMENTS

Figure 1:
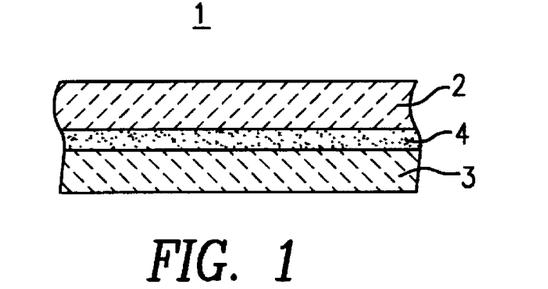
FIG. 1 is a sectional view schematically showing a portion of a multilayered ceramic substrate in accordance with an embodiment of the present invention.
Figure 2:
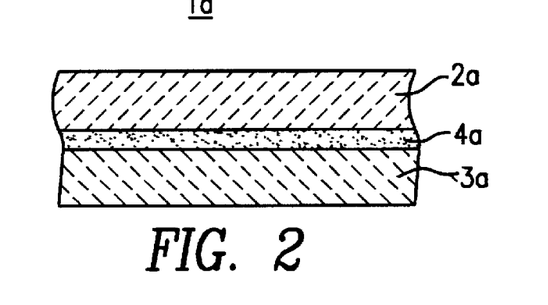
FIG. 2 is a sectional view schematically showing a portion of a green composite laminated product prepared for obtaining the multilayered ceramic substrate shown in FIG. 1.

FIG. 1 is a sectional view showing a portion of a multilayered ceramic substrate 1 in accordance with an embodiment of the present invention. FIG. 2 is a sectional view schematically showing a portion of a green composite laminated product 1a prepared for obtaining the multilayered ceramic substrate 1 shown in FIG. 1. In FIGS. 1 and 2, wiring conductors are not shown for the sake of simplifying description.

Referring to FIG. 1, the multilayered ceramic substrate 1 comprises two layers, i.e., first and second substrate ceramic layers 2 and 3 containing first and second different low-temperature sintered ceramic materials, respectively.

The multilayered ceramic substrate 1 further comprises a shrinkage inhibiting layer 4 arranged between the first and second substrate ceramic layers 2 and 3. The shrinkage inhibiting layer 4 contains an inorganic material in an unsintered state, and which does not sinter at the sintering temperature of each of the first and second low-temperature sintered ceramic materials. In the shrinkage inhibiting layer 4, glass permeates into the inorganic material when firing each of the first and second low-temperature sintered ceramic materials contained in the first and second substrate ceramic layers, respectively, so that the inorganic material is fixed by the glass.

In order to obtain the multilayered ceramic substrate 1, the green composite laminated product 1a shown in FIG. 2 is prepared.

Referring to FIG. 2, the green composite laminated product 1a comprises first and second substrate green sheets 2a and 3a containing the first and second low-temperature sintered ceramic materials, respectively, and a shrinkage inhibiting green sheet 4a arranged between the first and second substrate green sheets 2a and 3a and containing the above-described inorganic material.

In order to obtain the green composite laminated product 1a, first a slurry containing the first low-temperature sintered ceramic material, a slurry containing the second low-temperature sintered ceramic material, and a slurry containing the inorganic material are prepared. Each of the slurries is formed to a sheet on an appropriate carrier film by using, for example, a doctor blade method to form each of the first and second substrate green sheets 2a and 3a, and the shrinkage inhibiting green sheet 4a. These green sheets 2a, 3a and 4a are laminated in the predetermined order, and pressed according to demand to obtain the green composite laminated product 1a.

In place of the above-described method, another method may be used, in which each of the first and second substrate green sheets 2a and 3a is formed, the slurry containing the inorganic material is coated on one of the first and second substrate green sheets 2a and 3a to form the shrinkage inhibiting green sheet 4a, and then the other of the first and second substrate green sheets 2a and 3a is laminated.

A further process may be used in which the shrinkage inhibiting green sheet 4a is first formed, and then the slurry containing one of the first and second low-temperature sintered ceramic materials is coated on the shrinkage inhibiting green sheet 4a to form one of the first and second substrate green sheets 3a and 3a.

The thus-formed green composite laminated product 1a is pressed according to demand, and then fired in air or a reducing atmosphere to obtain the multilayered ceramic substrate 1.

In the firing step, the first and second low-temperature sintered ceramic materials respectively contained in the first and second substrate green sheets 2a and 3a are sintered while inhibiting shrinkage in the direction of the main surfaces of each of the first and second substrate green sheets 2a and 3a by the shrinkage inhibiting green sheet 4a. Although the inorganic material contained in the shrinkage inhibiting green sheet 4a remains unsintered, glass permeates into the inorganic material when firing each of the first and second low-temperature sintered ceramic materials so that the inorganic material is fixed by the glass.

As described above, sintering the first and second low-temperature sintered ceramic materials respectively contained in the first and second substrate green sheets 2a and 3a proceeds while the first and second substrate green sheets 2a and 3a are restrained by the shrinkage inhibiting green sheet 4a to inhibit shrinkage in the direction of the main surfaces of each of the first and second substrate green sheets 2a and 3a. Therefore, shrinkage substantially occurs in the substrate green sheets 2a and 3a in only the direction of the thickness thereof. However, with such shrinkage in the direction of the thickness, this difference causes no shrinkage in the direction parallel to the main surfaces, thereby causing no stress in the interface therebetween, even when there is a difference between the shrinkage behaviors of the first and second substrate green sheets 2a and 3a. Therefore, the multilayered ceramic substrate 1 can be obtained by simultaneous firing without causing layer peeling or cracks in the layers.

Although it is difficult to determine the degree of glass permeation in the firing step, the glass permeation is preferably set so that glass flow starts at the sintering start temperature of each of the low-temperature sintered ceramic materials, and glass permeation from the first and second substrate ceramic layers 2 and 3 to the shrinkage inhibiting layer 4 terminates in the sintering end temperature region.

By such setting, the glass diffusing and permeating from each of the first and second substrate green sheets 2a and 3a is absorbed and fixed by the shrinkage inhibiting green sheet 4a or the shrinkage inhibiting layer 4, and thus less glass diffuses from the first substrate green sheet 2a to the second substrate green sheet 3a, or vice versa, thereby effectively preventing characteristics from being changed or deteriorating due to contamination of the first and second substrate ceramic layers 2 and 3 with the foreign glass.

In order to obtain fixing strength between the respective layers, mutual diffusion in a thickness region of about 2 to 3 $\mu$m in the interfaces between the first and second substrate ceramic layers 2 and 3, and the shrinkage inhibiting layer 4 is required.

It is confirmed by the experiment described below that from the viewpoint of such glass diffusion and the exhibition of the sufficient shrinkage inhibiting effect, the thickness of the shrinkage inhibiting green sheet 4a is preferably selected from the range from about 1 $\mu$m to less than about 30 $\mu$m.

With the shrinkage inhibiting green sheet 4a having a thickness of more than the above range, the amount of the glass required for fixing the inorganic material is increased by an amount corresponding to an increase in thickness. On the other hand, where a large amount of glass permeates from the first and second substrate green sheets 2a and 3a and is absorbed by the shrinkage inhibiting green sheet 4a, a good sintered state cannot be obtained in the first and second substrate ceramic layers 2 and 3.

Therefore, at least one additive selected from glass, oxides and metals is preferably added to the shrinkage inhibiting green sheet 4a in order to decrease the amount of the glass permeating into the voids of the inorganic material to support fixing of the inorganic material. The type and the amount of the additive must be selected so as to prevent sintering shrinkage of the shrinkage inhibiting green sheet 4a at a temperature, for example, about 1000° C. or less. It is confirmed by the experiment described below that the amount of the additive is preferably about 60% by weight or less based on the inorganic material.

By adding the specified additive to the shrinkage inhibiting green sheet 4a, the thickness of the shrinkage inhibiting green sheet 4a can be increased to about 50 $\mu$m. An increase in the thickness of the shrinkage inhibiting green sheet 4a can prevent the occurrence of contamination of the substrate ceramic layers 2 and 3 with the diffusing foreign glass, and decrease the frequency of deterioration in characteristics due to the effect of contamination with the foreign glass. Furthermore, the characteristics of the substrate ceramic layers 2 and 3 are not effected by a variation in the thickness of the shrinkage inhibiting green sheet 4a, and thus the multilayered ceramic substrate 1a having stable characteristics can be produced.

Preferably, the first and second low-temperature sintered ceramic materials can be sintered at a temperature of about 1000° C. or less. By using the low-temperature sintered ceramic materials which can be sintered at a temperature of about 1000° C. or less, the multilayered ceramic substrate can be obtained by firing at the same time as wiring conductors (not shown in FIG. 1) composed of a metal such as copper or silver.

Although the low-temperature sintered ceramic materials produce fused glass by firing, glass may be initially contained in ceramic to allow sintering at low temperature or ceramic may be vitrified by reaction with an oxide to produce a glass during firing.

Examples of glass which can previously be contained in ceramic include borosilicate glass, lead borosilicate glass, barium borosilicate glass, bismuth borosilicate glass, and the like.

As the oxide which produces glass by fusion during firing, for example, barium oxide, and a combination of silicon oxide and boron oxide can be used.

As the ceramic contained in the low-temperature sintered ceramic materials, insulating ceramics such as alumina, and dielectric ceramics such as barium titanate, and magnetic ceramics such as ferrite can be used. The first and second substrate green sheets 2a and 3a may contain different types of ceramics.

The inorganic material contained in the shrinkage inhibiting green sheet 4a preferably has a sintering temperature about 100° C. or more higher than the sintering temperature of each of the low-temperature sintered ceramic materials. Therefore, any inorganic materials such as a dielectric material, a magnetic material, a resistor, a superconductor, a piezoelectric material, a pyroelectric material, a semiconductor, a high-thermal-conductance material, a metal, and the like can be used as the inorganic material. More specifically, for example, alumina, zirconia, aluminum nitride or boron nitride can be advantageously used.

As described above, with the shrinkage inhibiting green sheet 4a containing at least one additive selected from glass, oxides and metals, the sintering temperatures of the additive and the inorganic material are preferably about 100° C. or more higher than the sintering temperature of each of the low-temperature sintered ceramic materials.

Figure 3:
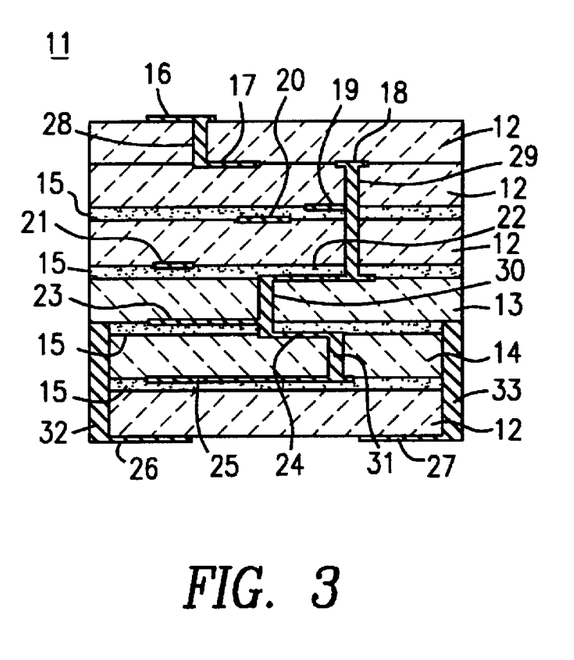
FIG. 3 is a sectional view schematically showing a multilayered ceramic substrate in accordance with another embodiment of the present invention.

FIG. 3 schematically shows a multilayered ceramic substrate 11 in accordance with another embodiment of the present invention.

The multilayered ceramic substrate 11 comprises a first substrate ceramic layer 12 containing a first low-temperature sintered ceramic material, a second substrate ceramic layer 13 containing a second low-temperature sintered ceramic material, and a third substrate ceramic layer 14 containing a third low-temperature sintered ceramic material.

The multilayered ceramic substrate 11 further comprises a shrinkage inhibiting layer 15 containing an inorganic material in an unsintered state and which is not sintered at the sintering temperature of each of the first to third low-temperature sintered ceramic materials.

In the multilayered ceramic substrate 11 illustrated, the first to third substrate ceramic layers 12 to 14 and the shrinkage inhibiting layer 15 are laminated in the order of the first substrate ceramic layer 12, the shrinkage inhibiting layer 15, the third substrate ceramic layer 14, the shrinkage inhibiting layer 15, the second substrate ceramic layer 13, the shrinkage inhibiting layer 15, the first substrate ceramic layer 12, the shrinkage inhibiting layer 15, the first substrate ceramic layer 12, and the first substrate ceramic layer 12 from the bottom.

In the shrinkage inhibiting layer 15 held between the first substrate ceramic layer 12 and the third substrate ceramic layer 14, the fused glass produced by firing the first and third low-temperature sintered ceramic materials contained in the first and third substrate ceramic layers 12 and 14, respectively, permeates into the inorganic material contained in the shrinkage inhibiting layer 15 to fix the inorganic material.

In the shrinkage inhibiting layer 15 held between the third substrate ceramic layer 14 and the second substrate ceramic layer 13, the glass produced by firing the third and second low-temperature sintered ceramic materials contained in the third and second substrate ceramic layers 14 and 13, respectively, permeates.

In the shrinkage inhibiting layer 15 held between the second substrate ceramic layer 13 and the first substrate ceramic layer 12, the glass produced by firing the second and first low-temperature sintered ceramic materials contained in the second and first substrate ceramic layers 13 and 12, respectively, permeates.

In the multilayered ceramic substrate 11, various wiring conductors are provided in connection with the substrate ceramic layers 12 to 14, and the shrinkage inhibiting layers 15. Some of the wiring conductors are described below.

As the wiring conductors, planar conductors 16 to 27 are provided along the main surfaces of the specified layers of the substrate ceramic layers 12 to 14. Each of the planar conductors 16 to 27 is patterned in a desired form.

As the wiring conductors, via hole conductors 28 to 33 are provided to pass through the specified substrate ceramic layers 12 to 14 and/or the shrinkage inhibiting layers 15. The via hole conductors 32 and 33 are exposed from the sides of the multilayered ceramic substrate 11.

With respect to the wiring conductors 16 to 33, the planar conductor 16 formed on the upper surface is used for mounting a chip-shaped electronic part (not shown). The planar conductors 26 and 27 formed on the lower surface, and the via hole conductors 32 and 33 respectively connected thereto are used for mounting the multilayered ceramic substrate 11 on a mother board (not shown).

In order to form these wiring conductors 16 to 33, for example, a conductive paste containing as a conductive component at least one metal selected from Ag, Au, Cu, Ag—Pd and Ag—Pt is used. The conductive paste can be obtained by adding a predetermined amount of organic vehicle to a powder comprising the metal, and then stirring and kneading the mixture.

Although the average particle diameter and particle shape of the metal powder are not limited, a powder having an average particle diameter of about 0.3 to 10 μm, which is not course powder or agglomerated powder, is preferably used.

The organic vehicle is obtained by mixing a binder resin and a solvent, and is not limited. Ethyl cellulose, acrylic resin, polyvinyl butyral, methacrylic resin, or the like can be used as the binder resin, and terpineol, butyl carbitol, butyl carbitol acetate, alcohol, or the like can be used as the solvent.

The conductive paste may contain a dispersant, a plasticizer, and additives according to demand.

In order to attain a match with the shrinkage behaviors of the low-temperature sintered ceramic materials contained in the substrate ceramic layers 12 to 14, 0 to about 70% by weight of glass frit or ceramic powder may be added.

From the viewpoint of printing quality, the viscosity of the conductive paste is preferably set to about 50 to 300 Pa·s.

In order to form the planar conductors 16 to 27, the conductive paste is coated in a desired pattern on each of the green sheets corresponding to the substrate ceramic layers 12 to 14 or the shrinkage inhibiting layers 15, for example, by screen printing. In order to form the via hole conductors 26 to 33, a through hole is provided in each of the corresponding green sheets so that the conductive paste is coated in the through hole, for example, by screen printing.

The multilayered ceramic substrate 11 shown in FIG. 3 can be produced by applying substantially the same firing step as the firing step for obtaining the multilayered ceramic substrate 1 shown in FIG. 1. The conductive paste is baked at the same time as the firing step to form the planar conductors 16 to 27 and the via hole conductors 28 to 33.

In FIG. 3, the via hole conductors 28 to 33 are shown in a state wherein the via hole conductors fill the through holes respectively provided in the corresponding layers of the substrate ceramic layers 12 to 14 and the shrinkage inhibiting layers 15. However, the via hole conductors may be formed only on the inner surfaces of the through holes.

The formation positions of the planar conductors 16 to 27 and the via hole conductors 28 to 33 shown in FIG. 3 are only examples, and various changes can be made according to demand.

The planar conductors 16 to 27 may also be formed by using a metallic foil or metallic wire in place of the conductive paste. In this case, for example, a metallic foil or metallic wire, which is punched in a desired shape, is heat-pressed on the corresponding green sheet, or a metallic foil is formed on an appropriate film by wet plating such as evaporation or sputtering, or dry plating such as electroless plating, patterned by etching, and then heat-transferred to the corresponding green sheets to form the planar conductors 16 to 27.

In the multilayered ceramic substrate 11 shown in FIG. 3, the inorganic materials contained in the plurality of the shrinkage inhibiting layers 15 may be generally the same or different.

As seen from the sectional structure of the multilayered ceramic substrate 11 shown in FIG. 3, the shrinkage inhibiting layers 15 are necessarily arranged between the substrate ceramic layers 12 to 14 of the different types. However, the shrinkage inhibiting layers 15 are not necessarily arranged between the substrate ceramic layers of the same type.

Figure 4:
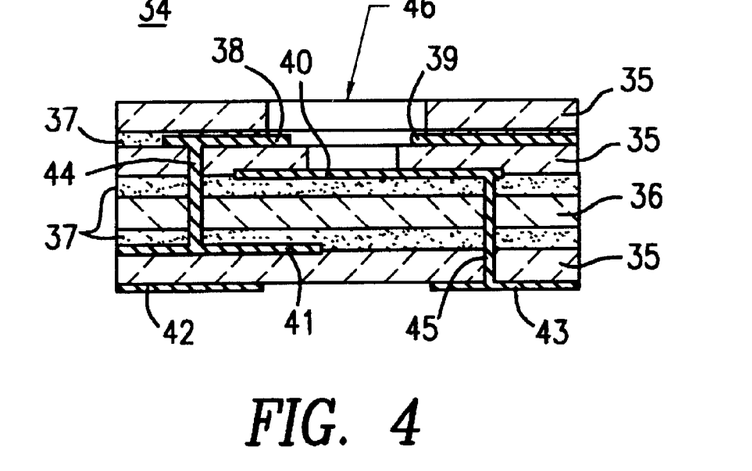
FIG. 4 is a sectional view schematically showing a multilayered ceramic substrate in accordance with a further embodiment of the present invention.

FIG. 4 is a sectional view schematically showing a multilayered ceramic substrate 34 in accordance with a further embodiment of the present invention.

The multilayered ceramic substrate 34 comprises a first substrate ceramic layer 35 containing a first low-temperature sintered ceramic material, a second substrate ceramic layer 36 containing a second low-temperature sintered ceramic material, and a shrinkage inhibiting layer 37 arranged between the adjacent layers of the substrate ceramic layers 35 and 36.

The shrinkage inhibiting layer 37 contains an inorganic material in an unsintered state, which is not sintered at the sintering temperature of each of the first and second low-temperature sintered ceramic materials. In the shrinkage inhibiting layers 37, glass produced by firing the low-temperature sintered ceramic material contained in each of the substrate ceramic layers 35 and 36 or the substrate ceramic layer 35 in contact with the shrinkage inhibiting layer 37 permeates into the inorganic material to fix the inorganic material.

The multilayered ceramic substrate 34 further comprises planar conductors 38 to 43 provided along the main surfaces of the specified layers of the substrate ceramic layers 35 and 36, and via hole conductors 44 and 45 provided to pass through the substrate ceramic layers 35 and 36 and/or the shrinkage inhibiting layers 37.

This embodiment is characterized in that the multilayered ceramic substrate 34 comprises a cavity 46 having an opening which faces the outer surface. The cavity 46 is formed by a series of through holes provided in the uppermost first substrate ceramic layer 35 of the multilayered ceramic substrate 34, the shrinkage inhibiting layer 37 located below the uppermost first substrate ceramic layer 35, and the first substrate ceramic layer 35 located below the shrinkage inhibiting layer 37. The cavity 46 may be made further deeper or shallower.

The multilayered ceramic substrate 34 can be produced by substantially the same method as the multilayered ceramic substrate 1 or 11.

Although not shown in the drawing, the cavity 46 of the multilayered ceramic substrate 34 is used for electrically connecting another electronic part such as a semiconductor chip to the planar conductors 38 to 40 while containing the electronic part. Although not shown in the drawing, the planar conductors 42 and 43 formed on the lower surface are used for mounting the multilayered ceramic substrate 34 on a mother board.

Description will now be made of an experimental example performed for defining the preferred embodiments of the present invention.

Figure 5:
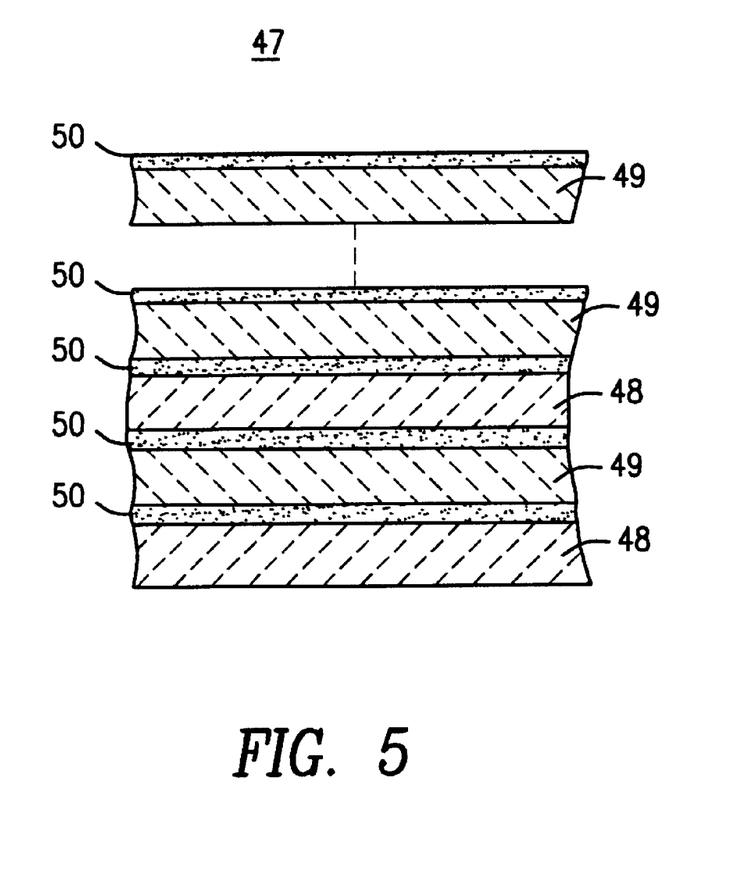
FIG. 5 is a sectional view showing a portion of a green composite laminated product prepared in an experimental example performed for defining the preferred embodiments of the present invention.

In this experimental example, the green composite laminated product 47 shown in FIG. 5 was prepared and fired to form a multilayered ceramic substrate. The green composite laminated product 47 comprised a first substrate green sheet 48 containing a first low-temperature sintered ceramic material, a second substrate green sheet 49 containing a second low-temperature sintered ceramic material, and a shrinkage inhibiting green sheet 50 containing an inorganic material. Five layers each of the first and second substrate green sheets 48 and 49 are alternately arranged, and the shrinkage inhibiting green sheet 50 is laminated on each of the substrate green sheets 48 and 49.

The thickness of each of the first and second substrate green sheets 48 and 49 was set to 100 $\mu$m, and the thickness of each of the shrinkage inhibiting green sheets 50 was set to various values, as shown in Table 1.

The first substrate green sheet 48 was formed as follows.

Polyvinyl butyral as a binder, di-n-butyl phthalate as a plasticizer, and toluene and isopropylene alcohol as a solvent were mixed with a mixture containing barium oxide, silicon oxide, alumina, calcium oxide and boron oxide to prepare a slurry. Next, the slurry was coated on a carrier film by using the doctor blade method to form a sheet, and then dried to obtain the first substrate green sheet 48.

The second substrate green sheet 49 was formed as follows.

A mixture of barium oxide, neodymium oxide, titanium oxide and boron oxide was heat-treated at a temperature of 1000° C. or more, and then ground. Next, polyvinyl butyral as a binder, di-n-butyl phthalate as a plasticizer, and toluene and isopropylene alcohol as a solvent were added to the powder obtained by grinding to prepare a slurry. Next, the slurry was coated on a carrier film by using the doctor blade method to form a sheet, and then dried to obtain the second substrate green sheet 49.

Next, a slurry for forming the shrinkage inhibiting green sheet 50 was prepared as follows.

As shown in Table 1 below, alumina and other inorganic materials were used as the inorganic material, and Si—B—Ba glass and other additives were respectively added to some samples in the amounts shown in Table 1. The softening point of the Si—B—Ba glass used in this example was 880° C. Next, polyvinyl butyral as a binder, di-n-butyl phthalate as a plasticizer, and toluene and isopropylene alcohol as a solvent were added to the each of these inorganic materials to obtain a slurry. The sintering temperature of the inorganic material contained in the slurry of each sample or the sintering temperature of the inorganic material and the additive is shown in Table 1. The sintering temperature of the low-temperature sintered ceramic material contained in each of the first and second substrate green sheets 48 and 49 was 900° C.

The thus-obtained slurry was coated on each of the first and second substrate green sheets 48 and 49, and then dried to form the shrinkage inhibiting green sheet 50 having the thickness shown in Table 1 on each of the substrate green sheets 48 and 49.

Next, five layers each of the first and second substrate green sheets 48 and 49 on each of which the shrinkage inhibiting green sheet 50 was formed as described above were alternately laminated, and then pressed at a temperature of 80° C. under a pressure of 200 kg/cm² to obtain the green composite laminated product 47 shown in FIG. 5.

Next, the thus-obtained green composite laminated product 47 was fired in air at a temperature of 1000° C. for 1 hour to obtain a multilayered ceramic substrate.

Table 1 shows the evaluation result of the rate of firing shrinkage of each sample in the direction parallel to the main surfaces. In Table 1, "NG" shown in the column of "rate of shrinkage" means that the occurrence of layer peeling was observed.

substrate obtained by firing the green composite laminated product 47 comprising the shrinkage inhibiting green sheet 50.

The influence of the thickness of the shrinkage inhibiting green sheet 50 on the sintered state of the multilayered ceramic substrate can be evaluated by reference to samples 1 to 8. Namely, the shrinkage inhibiting green sheet 50 is not formed in the sample 1, and in the samples 2 to 8, the thickness of the shrinkage inhibiting green sheet 50 is changed in the range of 0.5 to 30 μm with alumina contained as the inorganic material in each of these samples.

In the samples 1 and 2 in which the thickness of the shrinkage inhibiting green sheet 50 is less than 1 μm, and the sample 8 in which the thickness is 30 μm or more, layer peeling occurs. This indicates that the thickness of the shrinkage inhibiting green sheet 50 is preferably about 1 μm to less than about 30 μm. This is possibly due to the fact that with the shrinkage inhibiting green sheet 50 having a thickness of less than about 1 μm, the effect of inhibiting the shrinkage of the substrate green sheets 48 and 49 during firing is insufficient, while with the shrinkage inhibiting green sheet 50 having a thickness of about 30 μm or more, glass does not sufficiently permeates from the substrate green sheets 48 and 49.

Comparison of the sample 8 with samples 9 and 10 indicates that by adding an additive such as glass or a metal to the shrinkage inhibiting green sheet 50, fixing the inorganic material in the shrinkage inhibiting green sheet 50 is

TABLE 1

| Sample No. | Inorganic Material | Additive Composition | Additive Amount (% by weight) | Sintering temperature (° C.) | Thickness (μm) | Rate of shrinkage (%) |
|---|---|---|---|---|---|---|
| 1 | — | — | — | — | None | NG |
| 2 | Alumina | — | — | 1500 | 0.5 | NG |
| 3 | Alumina | — | — | 1500 | 1 | 97 |
| 4 | Alumina | — | — | 1500 | 5 | 98 |
| 5 | Alumina | — | — | 1500 | 10 | 98 |
| 6 | Alumina | — | — | 1500 | 15 | 98 |
| 7 | Alumina | — | — | 1500 | 20 | 98 |
| 8 | Alumina | — | — | 1500 | 30 | NG |
| 9 | Alumina | Si—B—Ba glass | 5 | 1400 | 30 | 98 |
| 10 | Alumina | Cu | 10 | 1100 | 30 | 97 |
| 11 | Alumina | MnO | 3 | 1500 | 25 | 98 |
| 12 | Alumina | CuO | 15 | 1300 | 25 | 97 |
| 13 | Alumina | Si—B—Ba glass | 30 | 1200 | 50 | 98 |
| 14 | Alumina | Si—B—Ba glass | 60 | 1100 | 50 | 98 |
| 15 | Alumina | Si—B—Ba glass | 80 | 950 | 50 | NG |
| 16 | Alumina | Si—B—Ba glass | 20 | 1250 | 60 | NG |
| 17 | Zirconium oxide | — | — | 1500 | 15 | 98 |
| 18 | Zirconium oxide | Si—B—Ba glass | 20 | 1300 | 50 | 98 |
| 19 | Aluminum nitride | — | — | 1600 | 5 | 98 |
| 20 | Ruthenium oxide | — | — | 1400 | 5 | 98 |
| 21 | Barium titanate | — | — | 1300 | 5 | 97 |
| 22 | Mullite | — | — | 1200 | 5 | 97 |
| 23 | Cordierite | — | — | 1100 | 5 | 97 |
| 24 | Wollastonite | — | — | 1050 | 5 | 97 |
| 25 | Anorthite glass | — | — | 970 | 5 | NG |

With reference to Table 1, consideration is given to the influence of the shrinkage inhibiting green sheet 50 of each sample on the sintered state of the multilayered ceramic supported, and even with a shrinkage inhibiting green sheet 50 having a thickness of about 30 μm or more, no layer peeling occurs.

Comparison between samples 13, 14 and 18 reveals that by adding the above additive, the thickness of the shrinkage inhibiting green sheet 50 can be increased to about 50 mm, and the multilayered ceramic substrate can be produced with no layer peeling.

Like in sample 16 in which the shrinkage inhibiting green sheet 50 has a thickness of 60 µm, layer peeling occurs even with the additive. This indicates that even with the additive added, the shrinkage inhibiting green sheet 50 preferably has a thickness of about 50 µm or less.

Samples 11 and 12 indicate that the additive is not limited to glass and a metal or an oxide may be used.

Like in sample 15 in which the amount of the additive added exceeds 60% by weight, i.e., 80% by weight, the sintering temperature is 950° C. which is not about 100° C. or more higher than the sintering temperature of 900° C. of the low-temperature sintered ceramic material, and thus the shrinkage inhibiting green sheet 50 did not function to inhibit shrinkage of the substrate green sheets 48 and 49, thereby causing layer peeling in the multilayered ceramic substrate. This result reveals that the sintering temperature of the inorganic material contained in the shrinkage inhibiting green sheet 50 or the sintering temperature of the inorganic material and the additive is preferably about 100° C. or more higher than the sintering temperature of the low-temperature sintered ceramic material.

In producing a multilayered ceramic substrate in the present invention, different types of substrate green sheets containing different low-temperature sintered ceramic materials are fired in a state in which a shrinkage inhibiting green sheet containing an inorganic material which does not sinter at the sintering temperature of each of the low-temperature sintered ceramic materials, is arranged between the substrate green sheets. As a result, each of the substrate green sheets shrinks in the direction of the thickness, but shrinkage of each of the substrate green sheets in the direction parallel to the main surfaces thereof is inhibited by the shrinkage inhibiting green sheet. Even with a difference between the shrinkage behaviors of the different types of substrate green sheets in the direction of the thickness, the substrate green sheets exert no stress on each other. Therefore, in a laminated state, the different types of substrate green sheets having a difference in shrinkage behavior can be simultaneously fired without causing layer peeling or cracks, and thus a multilayered ceramic substrate comprising different types of substrate green sheets can be efficiently produced by simultaneous firing.

Since shrinkage of the substrate green sheets in the direction parallel to the main surfaces thereof is inhibited, as described above, the positional precision of wiring conductors provided in connection with a green composite laminated product can be kept high in the multilayered ceramic substrate after firing.

In the multilayered ceramic substrate of the present invention, glass permeates into the shrinkage inhibiting layer from the substrate ceramic layers so that the inorganic material contained in the shrinkage inhibiting layer is fixed by the glass, thereby preventing contamination of each of the substrate ceramic layers with foreign glass, and preventing a change or deterioration in characteristics of each of the substrate ceramic layers.

Also, the inorganic material contained in the shrinkage inhibiting layer is fixed by glass to ensure the moisture resistance of the shrinkage inhibiting layer and keep the reliability of the multilayered ceramic substrate high. The shrinkage inhibiting layer can be used to function as, for example, a stress buffer for cases in which thermal expansion occurs.

In the firing step for obtaining the multilayered ceramic substrate of the present invention, sintering can be achieved at a relatively low temperature of about 1000° C. or less, for example. Therefore, as the conductor material for forming wiring conductors provided in connection with the multilayered ceramic substrate, low-resistance metals, for example, such as Ag, Au, Cu, Ag—Pd and Ag—Pt can be advantageously used.

Furthermore, since the wiring conductors can be formed with high positional precision, as described above, wiring conductors such as planar conductors provided along the main surfaces of specified substrate ceramic layers and via hole conductors provided to pass through specified substrate ceramic layers and/or the shrinkage inhibiting layer can be formed with a high density.

In the firing step, shrinkage of the substrate green sheets in the direction parallel to the main surfaces thereof is inhibited, thereby permitting the formation of a cavity having an opening, which faces the outer surface, in the multilayered ceramic substrate.

In the method of producing a multilayered ceramic substrate of the present invention, the thickness of the shrinkage inhibiting green sheet is set to about 1 µm to less than about 30 µm so that the shrinkage inhibiting effect of the shrinkage inhibiting green sheet can be securely obtained. Furthermore, the inorganic material contained in the shrinkage inhibiting green sheet can be securely fixed by the glass supplied from the substrate green sheets.

By increasing the thickness of the shrinkage inhibiting green sheet to, for example, about 30 µm or more, it is possible to securely prevent the contamination of different types of substrate green sheets with foreign glass. On the other hand, with the shrinkage inhibiting layer having an excessively increased thickness, the amount of the glass required for fixing the inorganic material is increased to deteriorate the sinterability of the substrate ceramic layers.

In order to solve this problem, at least one additive selected from glass, oxides and metals for supporting fixing of the inorganic material is preferably added to the shrinkage inhibiting layer in an amount of about 60% by weight or less based on the inorganic material. In this case, the thickness of the shrinkage inhibiting layer can be increased to about 50 µm, thereby securely preventing contamination with foreign glass.

While the invention has been particularly shown and described with reference to preferred embodiments thereof, it will be understood by those skilled in the art that the forgoing and other changes in form and details may be made therein without departing from the spirit of the invention.

What is claimed is:

1. A sintered multilayered ceramic substrate comprising:
   a first substrate ceramic layer and a second substrate ceramic layer respectively comprising first and second different low-temperature sintered ceramic materials and which exude glass when sintered; and
   a shrinkage inhibiting layer between the first and second substrate ceramic layers, the shrinkage inhibiting layer comprising an unsintered inorganic material which does not sinter at the sintering temperature of each of the first and second low-temperature sintered ceramic materials, said unsintered inorganic material being in combination with glass permeated into said shrinkage inhibiting layer during firing of the first and second low-temperature sintered ceramic materials contained in the first and second substrate ceramic layers,
   wherein said first substrate ceramic layer, second substrate ceramic layer and shrinkage inhibiting layer are cosintered layers.

2. A multilayered ceramic substrate according to claim 1, further comprising a wiring conductor in contact with at least one of the substrate ceramic layers or the shrinkage inhibiting layer or both.

3. A multilayered ceramic substrate according to claim 2, wherein the wiring conductor comprises a conductive material comprising at least one member selected from the group consisting of Ag, Au, Cu, Ag—Pd and Ag—Pt.

4. A multilayered ceramic substrate according to claim 2, wherein the wiring conductor comprises a planar conductor disposed along a main surface of one of the first and second substrate ceramic layers or a via hole conductor disposed through a substrate ceramic layer or shrinkage inhibiting layer or both.

5. A multilayered ceramic substrate according to claim 2, wherein said multilayer substrate includes a cavity with an opening which extends from an outer layer of the ceramic substrate.

6. A multilayered ceramic substrate according to claim 2, wherein each of the low-temperature sintered ceramic materials sinters at a temperature of about 1000° C. or less.

7. A multilayered ceramic substrate according to claim 2, wherein the thickness of the shrinkage inhibiting layer is in the range of about 1 $\mu$m to less than about 30 $\mu$m.

8. A multilayered ceramic substrate comprising:
   a first substrate ceramic layer and a second substrate ceramic layer respectively comprising first and second different low-temperature sintered ceramic materials and which exude glass when sintered;
   a shrinkage inhibiting layer between the first and second substrate ceramic layers, the shrinkage inhibiting layer comprising an unsintered inorganic material which does not sinter at the sintering temperature of each of the first and second low-temperature sintered ceramic materials, said unsintered inorganic material being in combination with glass permeated into said shrinkage inhibiting layer during firing of the first and second low-temperature sintered ceramic materials contained in the first and second substrate ceramic layers; and
   a wiring conductor in contact with at least one of the substrate ceramic layers or the shrinkage inhibiting layer or both,
   wherein the shrinkage inhibiting layer contains at least one additive selected from glass, oxides and metals in an amount of about 60% by weight or less based on the inorganic material.

9. A multilayered ceramic substrate according to claim 8, wherein the thickness of the shrinkage inhibiting layer is about 50 $\mu$m or less.

10. A method of producing a multilayered ceramic substrate comprising:
    providing a green composite laminate comprising first and second substrate green sheets respectively containing first and second different low-temperature sinterable ceramic materials and which first and second substrate green sheets exude glass when sintered, and a shrinkage inhibiting green sheet disposed between the first and second substrate green sheets, the shrinkage inhibiting green sheet comprising an inorganic material which does not sinter at the sintering temperature of each of the first and second low-temperature sintered ceramic materials and which accepts permeation of glass therein; and
    firing the green composite laminate at a temperature at which the first and second low-temperature sinterable ceramic material contained in the first and second substrate green sheets sinter and the first and second substrate green sheets exude glass and at which the shrinkage inhibiting green sheet accepts glass permeating into the inorganic material while at the same time inhibiting shrinkage in the direction substantially parallel to main surfaces of the first and second substrate green sheets, said temperature being insufficient to sinter the inorganic material in the shrinkage inhibiting green sheet.

11. A method of producing a multilayered ceramic substrate according to claim 10, wherein a wiring conductor is disposed in contact with at least one of the substrate green sheets or the shrinkage inhibiting green sheet or both before the green composite laminate is fired.

12. A method of producing a multilayered ceramic substrate according to claim 11, wherein the providing the green composite laminate comprises preparing each of the first and second substrate green sheets and the shrinkage inhibiting green sheet, and forming a laminate of the green sheets thus prepared.

13. A method of producing a multilayered ceramic substrate according to claim 11, wherein the providing the green composite laminate comprises preparing the first and second substrate green sheets, preparing a slurry containing the inorganic material, coating the slurry on at least one substrate green sheet to thereby form the shrinkage inhibiting green sheet, and forming a laminate of the green sheets thus prepared.

14. A method of producing a multilayered ceramic substrate according to claim 11, wherein each of the first and second low-temperature sinterable ceramic materials can be sintered at a temperature of about 1000° C. or less.

15. A method of producing a multilayered ceramic substrate according to claim 11, wherein the thickness of the shrinkage inhibiting green sheet is in the range of about 1 $\mu$m to less than about 30 $\mu$m.

16. A method of producing a multilayered ceramic substrate according to claim 11, wherein the shrinkage inhibiting green sheet before firing contains at least one additive selected from glass, oxides and metals in an amount of about 60% by weight or less based on the inorganic material.

17. A method of producing a multilayered ceramic substrate according to claim 16, wherein the thickness of the shrinkage inhibiting green sheet is about 50 $\mu$m or less.

18. A method of producing a multilayered ceramic substrate according to claim 17, wherein the sintering temperature of the shrinkage inhibiting green sheet comprising the inorganic material and the additive is at least about 100° C. higher than the sintering temperature of each of the first and second low-temperature sinterable ceramic materials.

19. A method of producing a multilayered ceramic substrate according to claim 11, wherein the sintering temperature of the shrinkage inhibiting green sheet comprising the inorganic material is at least about 100° C. higher than the sintering temperature of each of the first and second low-temperature sinterable ceramic materials.

20. A method of producing a multilayered ceramic substrate according to claim 11, wherein the providing the green composite laminate comprises preparing a first substrate green sheet having a cavity which has an opening which faces an outer surface thereof and forming the green composite laminate such that said opening is disposed on a surface of said first substrate green sheet distant from said shrinkage inhibiting green sheet.

* * * * *